(12) United States Patent
Zeng et al.

(10) Patent No.: US 12,197,241 B2
(45) Date of Patent: Jan. 14, 2025

(54) JOYSTICK SENSOR

(71) Applicant: GUANGDONG K-SILVER INDUSTRIAL CO., LTD., Shenzhen (CN)

(72) Inventors: Xiao Zeng, Shenzhen (CN); Jianbo Zhao, Shenzhen (CN)

(73) Assignee: GUANGDONG K-SILVER INDUSTRIAL CO., LTD., Shenzhen (CN)

( * ) Notice: Subject to any disclaimer, the term of this patent is extended or adjusted under 35 U.S.C. 154(b) by 144 days.

(21) Appl. No.: 17/902,923

(22) Filed: Sep. 5, 2022

(65) Prior Publication Data

US 2023/0324945 A1 Oct. 12, 2023

(30) Foreign Application Priority Data

Apr. 7, 2022 (CN) .......................... 202220792740.3

(51) Int. Cl.
*G05G 9/047* (2006.01)
*H05K 1/18* (2006.01)

(52) U.S. Cl.
CPC ............. *G05G 9/047* (2013.01); *H05K 1/189* (2013.01); *G05G 2009/04744* (2013.01); *G05G 2009/04755* (2013.01)

(58) Field of Classification Search
CPC ......... G05G 9/047; G05G 2009/04744; G05G 2009/04755; G05G 2009/04718; H05K 1/189; H01H 25/002; H01H 25/008; H01H 25/04; H01H 2025/004
See application file for complete search history.

(56) References Cited

U.S. PATENT DOCUMENTS

| | | | |
|---|---|---|---|
| 11,366,485 B1* | 6/2022 | Domzalski | G05G 9/047 |
| 11,526,192 B2* | 12/2022 | Nakase | G05G 9/047 |
| 11,669,122 B2* | 6/2023 | Zeng | G05G 9/047 345/161 |
| 11,815,931 B2* | 11/2023 | Zeng | A63F 13/24 |
| 11,862,414 B1* | 1/2024 | Zeng | H01H 23/28 |

* cited by examiner

*Primary Examiner* — Lheiren Mae A Caroc
(74) *Attorney, Agent, or Firm* — Hemisphere Law, PLLC; Zhigang Ma

(57) ABSTRACT

A joystick sensor includes a housing, a reset assembly, a rocker assembly, a circuit assembly, the reset assembly, the rocker assembly and the circuit assembly are mounted on the housing; the rocker assembly includes two magnets, an upper rocker arm, a lower rocker arm, and a rocker body, one end of the upper rocker connected with one of the two magnets; one end of the rocker arm is connected with the other one of the two magnets, the other end of the lower rocker arm is secured a pressing block; the circuit assembly includes a flexible circuit board, two Hall IC elements, and a switch spring, the two Hall IC elements and the switch spring are arranged on the flexible circuit board, positions of the Hall IC elements respective correspond to positions of the magnets; a position of the switch spring corresponds to a position of the pressing block.

20 Claims, 4 Drawing Sheets

JOYSTICK SENSOR

CROSS REFERENCE TO RELATED APPLICATION

This non-provisional patent application claims priority under 35 U.S.C. § 119 from Chinese Patent Application No. CN202220792740.3 filed on Apr. 7, 2022, the entire content of which is incorporated herein by reference.

TECHNICAL FIELD

The disclosure relates to sensor technology, in particular to a joystick sensor and joystick controller.

BACKGROUND

The joystick sensor is one of the sensors and is often used as a VR joystick. The joystick sensor is mainly includes a rocker, two swing arms, a brush and a resistor piece. The rocker is toggled to drive the swing arm to operate, so that the brush moves on the carbon film to generate different resistance values, then generates different electrical signals which can use to control direction.

However, adjusting through the contact between the brush and the carbon film generally has the following defects: if a metal with greater elasticity is used as the brush, the brush wears quickly and the service life is short; if the metal with less elasticity is used as the brush When brushing, the contact between the brush and the carbon film is prone to poor contact and failure. If a high-hardness carbon film is used, the brushes will wear out quickly, which will generate large electrical noise; if a low-hardness carbon film is used, the surface of the carbon film will soon be ground toner by the brush, and the toner will also stick to the brush, affecting the electrical performance of the brush, causing the rocker device to malfunction.

Therefore, such joystick sensors generally have the defects of short service life and poor performance, which eventually lead to the "drift" problem of gamers during the game.

SUMMARY

To solve the above problem, according to various embodiments of the present application, joystick sensor is provided.

A joystick sensor is provided, and includes a housing, a reset assembly, a rocker assembly, a circuit assembly, the reset assembly, the rocker assembly and the circuit assembly mounted on the housing; the rocker assembly comprising two magnets, an upper rocker arm, a lower rocker arm, and a rocker body, one end of the upper rocker connected with one of the two magnets; one end of the rocker arm connected with the other one of the two magnets, the other end of the lower rocker arm secured a pressing block; the circuit assembly comprising a flexible circuit board, two Hall IC elements, and a switch spring, the two Hall IC elements and the switch spring arrange on the flexible circuit board, positions of the two Hall IC elements respective corresponding to positions of the two magnet; a position of the switch spring corresponding to a position of the pressing block.

In the above joystick sensor, the combination of the magnet and the Hall IC element is arranged to obtain the swing of the rocker assembly in two directions, and the corresponding electrical signal output is converted and output. This method has the advantage of stable output signal, and then the accuracy of the rocker is improved; and there is no contact between the magnet and the Hall IC element, thereby avoiding friction and improving the service life.

DETAILED DESCRIPTION OF THE EMBODIMENTS

Figure 1:
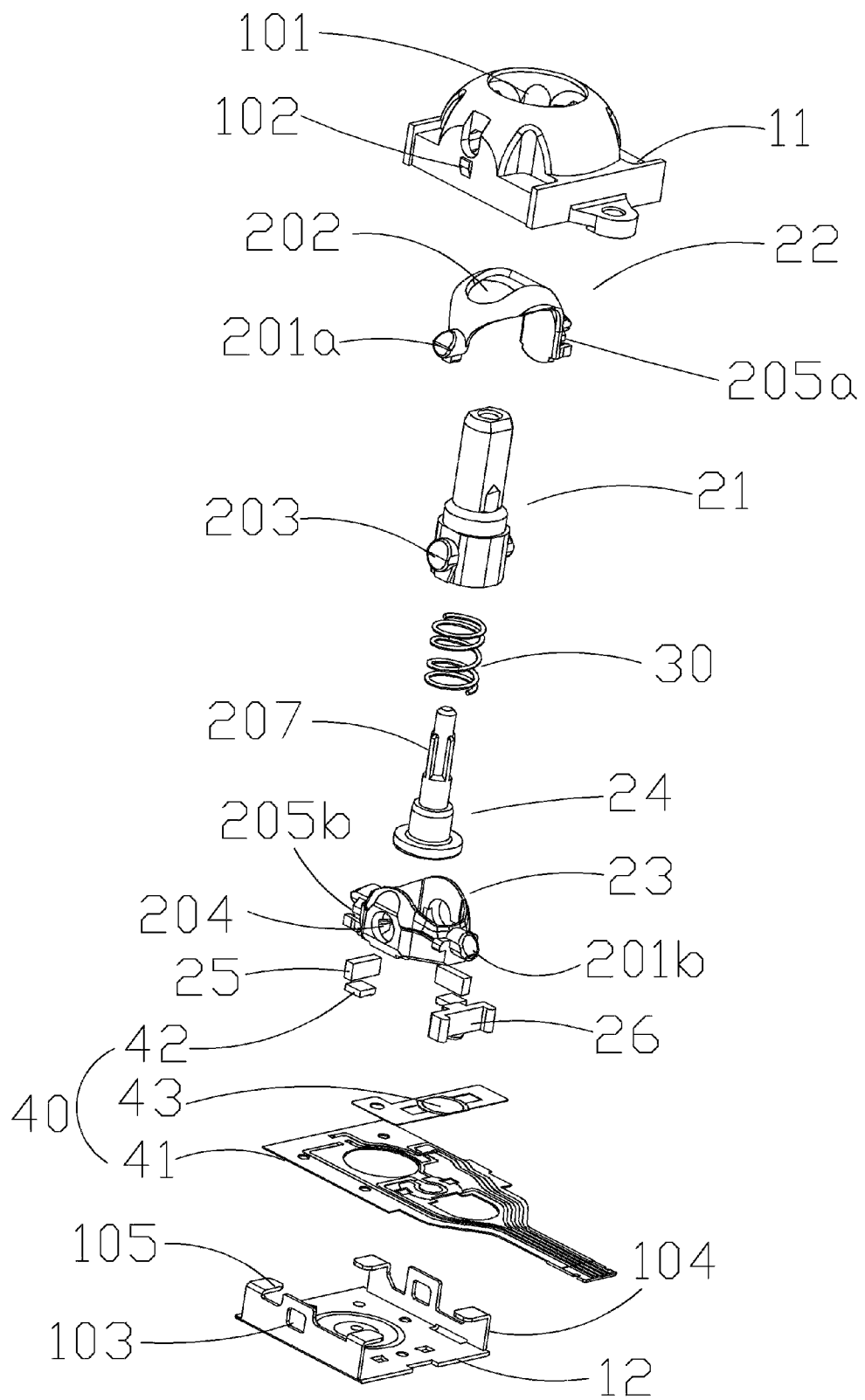
FIG. 1 is an exploded schematic diagram of an joystick sensor in accordance with an embodiment, the joystick sensor includes a housing, a rocker arm assembly, and a rocker body and a rocker base.
Figure 2:
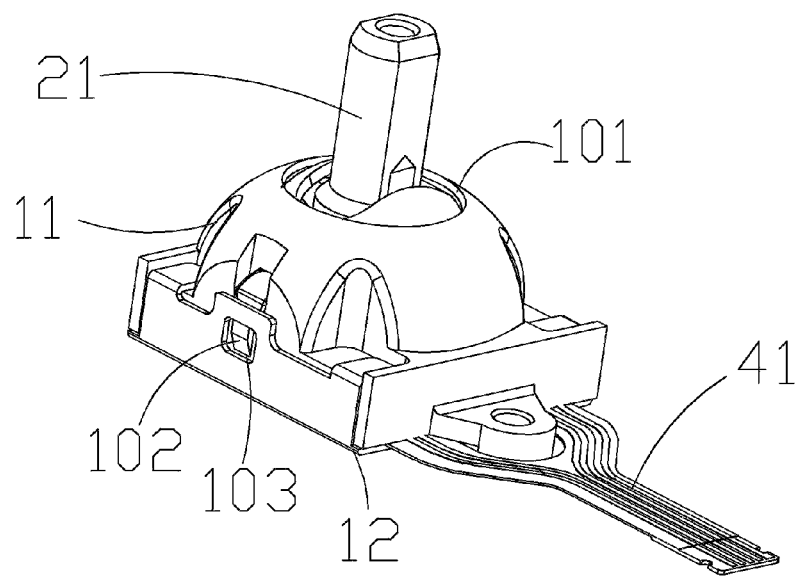
FIG. 2 is a perspective view of a joystick sensor.

The technical solution of the present invention will be clearly and completely described below in conjunction with the accompanying drawings. Obviously, the described embodiments are part of the embodiments of the present invention, rather than all of the embodiments. Based on the embodiments of the present invention, all other embodiments obtained by those of ordinary skill in the art without creative work shall fall within the protection scope of the present invention.

In the description of the present invention, it should be noted that the terms "center", "upper", "lower", "left", "right", "vertical", "horizontal", "inner", "outer", etc. The indicated orientation or positional relationship is based on the orientation or positional relationship shown in the drawings, and is only for the convenience of describing the present invention and simplifying the description, and does not indicate or imply that the pointed device or element must have a specific orientation or a specific orientation. The structure and operation cannot therefore be understood as a limitation of the present invention. In addition, the terms "first", "second", and "third" are only used for descriptive purposes, and cannot be understood as indicating or implying relative importance.

In the description of the present invention, it should be noted that, unless otherwise clearly specified and limited, the terms "installation", "connection" and "connection" should be understood in a broad sense, for example, it can be a fixed connection or a detachable connection, connected or integrally connected; it can be a mechanical connection or an electrical connection; it can be directly connected or indirectly connected through an intermediate medium, and it can be the internal communication between two assemblies. For those of ordinary skill in the art, the specific meaning of the above-mentioned terms in the present invention can be understood in specific situations.

The technical solutions of the disclosure will be clearly and completely described below with reference to the accompanying drawings. Obviously, the described embodiments are a part of embodiments of disclosure, but not all of the embodiments of the disclosure.

Referring to FIGS. 1 to 5, a joystick sensor is shown and includes a housing 10, a rocker assembly 20, a reset assembly 30 and a circuit assembly 40 mounted on the housing 10. The rocker assembly 20 includes an upper rocker arm 22, a lower rocker arm 23, and a rocker body 21. The circuit assembly 40 includes a flexible circuit board 41, and two Hall IC elements 42 and a switch spring 43 arranged on the flexible circuit board 41. One end of the upper rocker arm 22 and one end of the lower rocker arm 23 are respectively connected with one magnet 25, two magnets 25 correspond to the positions of the two Hall IC elements 42 respectively. The lower end of the other end of the lower rocker arm 23 is provided with a pressing block 26, and a position of the pressing block 26 corresponds to a position of the switch spring 43.

By integrating the Hall IC element 42 into the flexible circuit board 41, the flexible circuit board 41 is a magnetic induction IC board. The swing of the magnet 25 changes the distance between the magnet 25 and the Hall IC element 42. At this time, the magnetic induction IC board generates and outputs a corresponding electrical signal, so that the flexible circuit board 41 senses the moving direction of the rocker assembly 20, it is more accurate and the induction efficiency is improved.

Figure 3:
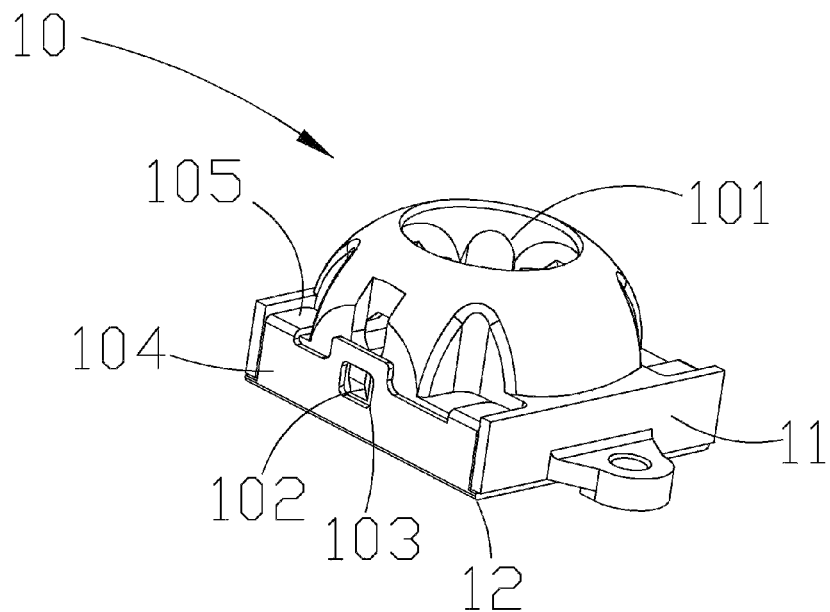
FIG. 3 is a schematic diagram of a connection of the housing.

Referring to FIG. 3, the housing 10 includes a shell 11 and a base 12, the shell 11 and the base 12 are engaged together to form an accommodating cavity. A top of the shell 11 defines a opening 101, the rocker body 21 is extending out of the housing by passing through the opening. In detail, the base 12 is a metal sheet, the outer edge of the base 12 is bent upwards by 90 degrees to form a side edge 104, the side edge 104 defines a buckle hole 103, the outer wall of the shell 11 is provided with a buckle 102, and the buckle 102 is buckled in the buckle hole 103.

The number of the side edges 104 is 2-4, and there is a gap between the side edges 104 to enable the flexible circuit board 41 to extend out of the the housing 10. In this embodiment, the two side edges 104 are symmetrically arranged, and both ends of the two side edges 104 are bent inward by 90 degrees to form a buckle edge 105, which is fastened to the casing 11.

Figure 4:
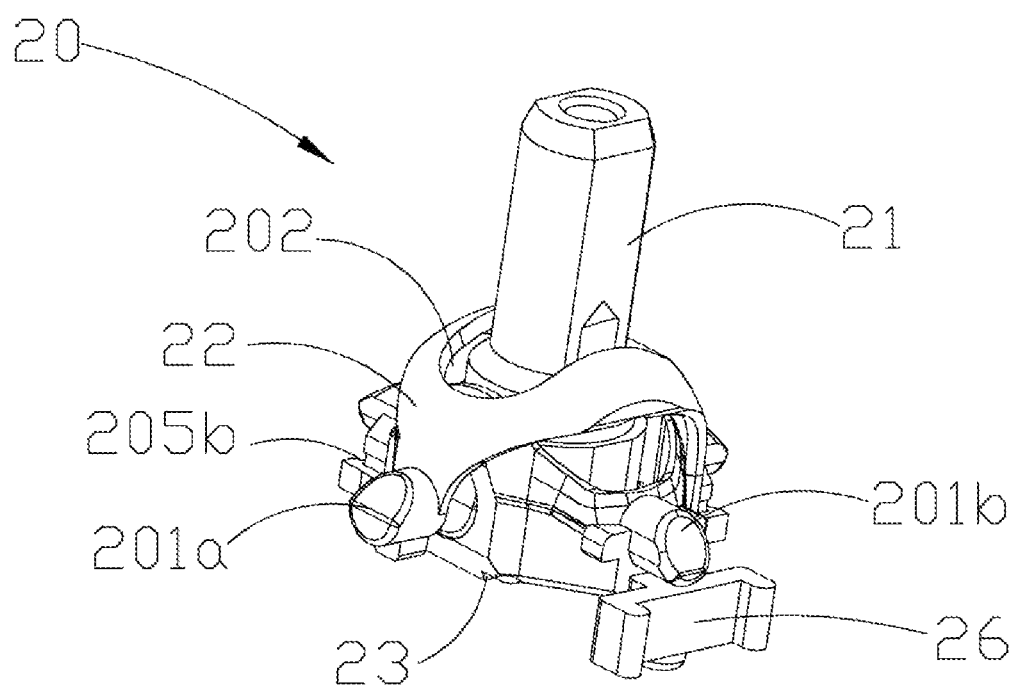
FIG. 4 is a schematic diagram of a connection of the rocker arm assembly.

The upper rocker arm 22 and the lower rocker arm 23 are orthogonally arranged in the shell 11 to each other, and the rocker body 21 are passed through the upper rocker arm 22 and the lower rocker arm 23. In detail, as shown in FIG. 4, both ends of the upper rocker arm 22 are provided with rotating shafts 201a, and both ends of the lower rocker arm 23 are provided with rotating shafts 201b. The upper rocker arm 22 and the lower rocker arm 23 are rotatably mounted to the shell 11 via the rotating shafts 201a and 201b. The upper rocker arm 22 defines a limit hole 202 for the upper part of the rocker body 21 to pass through. The lower part of the rocker body 21 is provided with a connecting column 203, the lower rocker arm 23 defines a connecting hole 204, and the connecting column 203 is inserted into the connecting hole 204.

One end of the upper rocker arm 22 is provided with a magnet mounting position 205a, and one end of the lower rocker arm 23 is provided with a magnet mounting position 205b. The magnet mounting positions 205a and 205b are respectively disposed under the rotating shafts 201a and 201b. The magnet mounting positions 205a and 205b are provided with clamping part, and the magnet 25 is clamped and mounted on the magnet mounting positions 205a and 205b via the clamping part.

The pressing block 26 is installed below the rotating shaft 201b at the other end of the lower rocker arm 23, and the pressing block 26 is placed above the switch spring 43. The switch spring 43 is fixed on the flexible circuit board 41 by a film. The flexible circuit board 41 is provided with electrical contacts under the switch spring 43. The rocker body 21 drives the lower rocker arm 23 to press down on the pressing block 26, and the switch spring 43 is connected to the electrical contacts. which triggers the joystick sensor to turn on or off.

Figure 5:
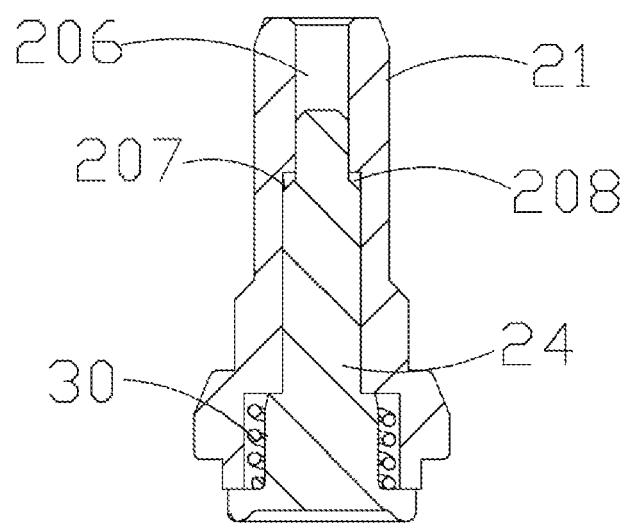
FIG. 5 is a schematic cross-sectional view of the reset assembly after being connected to rocker body and rocker base.

As shown in FIG. 5, the rocker assembly 20 further includes a rocker base 24, a receiving cavity 206 is defined at the bottom of the rocker body 21, and the upper part of the rocker base 24 is inserted into the receiving cavity 206. The reset assembly 30 includes a spring, the spring is sleeved on the rocker base 24, and the upper end of the spring is contacted with the bottom of the rocker body 21.

The rocker body 21 is movably connected to the rocker base 24 under the action of the spring, it prevents the rocker body 21 from being separated from the rocker base 24 during reset due to the reset assembly 30. The rocker base 24 is provided with a plurality of limit blocks 207 arranged along a circumference. The rocker body 21 defines corresponding limit slots 208 on an inner wall surrounding the receiving cavity 206, and the limit blocks 207 are inserted into the limit slots 208 to ensure the rocker body 21 fixed with the rocker base 24 in axial direction to prevent the rocker body 21 from rotating.

The above embodiments are only to describe the preferred embodiments of the joystick sensor, and do not limit the scope of the joystick sensor. On the premise of not departing from the design spirit of the joystick sensor, various modifications and changes made by ordinary engineers and technicians in the art to the technical solutions of the joystick sensor and improvements should all fall within the protection scope determined by the claims of the joystick sensor.

The invention claimed is:

1. A joystick sensor, comprising: a housing, a reset assembly, a rocker assembly, a circuit assembly, the reset assembly, the rocker assembly and the circuit assembly mounted on the housing; the rocker assembly comprising two magnets, an upper rocker arm, a lower rocker arm, and a rocker body, one end of the upper rocker arm connected with one of the two magnets; one end of the lower rocker arm connected with another one of the two magnets, another end of the lower rocker arm being secured to a pressing block; the circuit assembly comprising a flexible circuit board, two Hall IC elements, and a switch spring, the two Hall IC elements and the switch spring being arranged on the flexible circuit board, positions of the two Hall IC elements respectively corresponding to positions of the two magnets; a position of the switch spring corresponding to a position of the pressing block.

2. The joystick sensor according to claim 1, wherein the housing comprises a shell and a base, the shell and the base are assembled together to form an accommodating cavity, a top of the shell defines an opening, and an upper part of the rocker body extending out of the shell by passing through the opening.

3. The joystick sensor according to claim 2, wherein an outer wall of the shell is provided with a buckle, the base defines a buckle hole, and the buckle is engaged in the buckle hole.

4. The joystick sensor according to claim 3, wherein both ends of the upper rocker arm and both ends of the lower rocker arm are provided with rotating shafts, and the upper rocker arm and the lower rocker arm are rotatably connected with the shell via the rotating shafts.

5. The joystick sensor according to claim 4, wherein one end of the upper rocker arm and one end of the lower rocker arm are both provided with a magnet mounting position, and the magnet mounting positions are located below the rotating shafts.

6. The joystick sensor according to claim 5, wherein the upper rocker arm defines a limit hole for the upper part of the rocker body to pass through; a lower part of the rocker body is provided with a connecting column, the lower rocker arm defines a connecting hole, and the connecting column is inserted into the connecting hole.

7. The joystick sensor according to claim 6, wherein the rocker assembly further comprises a rocker base, a bottom of the rocker body defines a receiving cavity, and an upper part of the rocker base is inserted in the in the receiving cavity.

8. The joystick sensor according to claim 7, wherein the rocker base is provided with a plurality of limit blocks arranged along a circumference, the rocker body correspondingly defines limit slots on an inner wall of the receiving cavity, and the plurality of the limit blocks are inserted in the limit slots.

9. The joystick sensor according to claim 8, wherein the reset assembly comprises a spring, the spring is sleeved on the rocker base, and an upper end of the spring is contacted with the bottom of the rocker body.

10. The joystick sensor according to claim 1, wherein the switch spring is fixed to the flexible circuit board using a film adhesive method.

11. A joystick sensor, comprising: a housing, a reset assembly, a rocker assembly, and a circuit assembly; the reset assembly, the rocker assembly and the circuit assembly mounted on the housing; the rocker assembly comprising two magnets, an upper rocker arm, a lower rocker arm, and a rocker body, the upper rocker arm and the lower rocker arm being positioned orthogonally, the two magnets being mounted on one end of the upper rocker arm and one end of the lower rocker arm respectively; another end of the lower rocker arm being secured to a pressing block; the circuit assembly comprising a flexible circuit board, two Hall IC elements, and a switch spring, the two Hall IC elements and the switch spring being arranged on the flexible circuit board, the two Hall IC elements positioned corresponding to the two magnets respectively and generate different signals when the rocker body is operated to force the upper rocker arm and the lower rocker arm to move; the pressing block is pressed on or detached from the switch spring according to an operation on the rocker body.

12. The joystick sensor according to claim 11, wherein the housing comprises a shell and a base, the shell and the base are assembled together to form an accommodating cavity, atop of the shell defines an opening, and an upper part of the rocker body extending out of the shell by passing through the opening for being operated by a user.

13. The joystick sensor according to claim 12, wherein an outer wall of the shell is provided with a buckle, the base defines a buckle hole, and the buckle is engaged in the buckle hole.

14. The joystick sensor according to claim 13, wherein both ends of the upper rocker arm and both ends of the lower rocker arm are provided with rotating shafts, and the upper rocker arm and the lower rocker arm are rotatably connected with the shell via the rotating shafts.

15. The joystick sensor according to claim 14, wherein one end of the upper rocker arm and one end of the lower rocker arm are both provided with a magnet mounting position, and the magnet mounting positions are located below the rotating shafts.

16. The joystick sensor according to claim 15, wherein the upper rocker arm defines a limit hole for the upper part of the rocker body to pass through; a lower part of the rocker body is provided with a connecting column, the lower rocker arm defines a connecting hole, and the connecting column is inserted into the connecting hole.

17. The joystick sensor according to claim 16, wherein the rocker assembly further comprises a rocker base, a bottom of the rocker body defines a receiving cavity, and an upper part of the rocker base is inserted in the receiving cavity.

18. The joystick sensor according to claim 17, wherein the rocker base is provided with a plurality of limit blocks arranged along a circumference, the rocker body correspondingly defines limit slots on an inner wall of the receiving cavity, and the plurality of the limit-blocks are inserted in the limit slots.

19. The joystick sensor according to claim 18, wherein the reset assembly comprises a spring, the spring is sleeved on the rocker base, and an upper end of the spring is contacted with the bottom of the rocker body.

20. The joystick sensor according to claim 11, wherein the switch spring is fixed to the flexible circuit board through a film adhesive method.

* * * * *